(12) United States Patent
 Xie et al.

(10) Patent No.: US 9,240,412 B2
(45) Date of Patent: Jan. 19, 2016

(54) SEMICONDUCTOR STRUCTURE AND DEVICE AND METHODS OF FORMING SAME USING SELECTIVE EPITAXIAL PROCESS

(71) Applicant: ASM IP Holding B.V., Almere (NL)

(72) Inventors: Qi Xie, Leuven (BE); Vladimir Machkaoutsan, Leuven (BE); Jan Willem Maes, Wilrijk (BE)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 14/040,196

(22) Filed: Sep. 27, 2013

(65) Prior Publication Data

US 2015/0091057 A1    Apr. 2, 2015

(51) Int. Cl.
 *H01L 21/336* (2006.01)
 *H01L 27/092* (2006.01)
 *H01L 21/8238* (2006.01)

(52) U.S. Cl.
 CPC .... *H01L 27/0924* (2013.01); *H01L 21/823821* (2013.01)

(58) Field of Classification Search
 USPC .......................... 438/213, 223, 224, 284, 494
 See application file for complete search history.

(56) References Cited

U.S. PATENT DOCUMENTS

| | | |
|---|---|---|
| 2,745,640 A | 5/1956 | Cushman |
| 2,990,045 A | 9/1959 | Root |
| 3,833,492 A | 9/1974 | Bollyky |
| 3,854,443 A | 12/1974 | Baerg |
| 3,862,397 A | 1/1975 | Anderson et al. |
| 3,887,790 A | 6/1975 | Ferguson |
| 4,054,071 A | 10/1977 | Patejak |
| 4,058,430 A | 11/1977 | Suntola et al. |
| 4,145,699 A | 3/1979 | Hu et al. |
| 4,176,630 A | 12/1979 | Elmer |
| 4,181,330 A | 1/1980 | Kojima |
| 4,194,536 A | 3/1980 | Stine et al. |
| 4,322,592 A | 3/1982 | Martin |
| 4,389,973 A | 6/1983 | Suntola et al. |
| 4,393,013 A | 7/1983 | McMenamin |
| 4,436,674 A | 3/1984 | McMenamin |
| 4,499,354 A | 2/1985 | Hill et al. |
| 4,512,113 A | 4/1985 | Budinger |
| 4,570,328 A | 2/1986 | Price et al. |
| D288,556 S | 3/1987 | Wallgren |

(Continued)

FOREIGN PATENT DOCUMENTS

| | | |
|---|---|---|
| CN | 1563483 | 1/2005 |
| CN | 101330015 | 12/2008 |

(Continued)

OTHER PUBLICATIONS

USPTO; Notice of Allowance dated Jan. 27, 2015 in U.S. Appl. No. 12/763,037.

(Continued)

*Primary Examiner* — Chandra Chaudhari
(74) *Attorney, Agent, or Firm* — Snell & Wilmer LLP

(57) ABSTRACT

Semiconductor structures, devices, and methods of forming the structures and device are disclosed. Exemplary structures include multi-gate or FinFET structures that can include both re-channel MOS (NMOS) and p-channel MOS (PMOS) devices to form CMOS structures and devices on a substrate. The devices can be formed using selective epitaxy and shallow trench isolation techniques.

20 Claims, 13 Drawing Sheets

(56) References Cited

U.S. PATENT DOCUMENTS

| | | |
|---|---|---|
| 4,653,541 A | 3/1987 | Oehlschlaeger et al. |
| 4,722,298 A | 2/1988 | Rubin et al. |
| 4,735,259 A | 4/1988 | Vincent |
| 4,753,192 A | 6/1988 | Goldsmith et al. |
| 4,789,294 A | 12/1988 | Sato et al. |
| 4,821,674 A | 4/1989 | deBoer et al. |
| 4,827,430 A | 5/1989 | Aid et al. |
| 4,882,199 A | 11/1989 | Sadoway et al. |
| 4,986,215 A | 1/1991 | Yamada |
| 4,991,614 A | 2/1991 | Hammel |
| 5,062,386 A | 11/1991 | Christensen |
| 5,074,017 A | 12/1991 | Toya et al. |
| 5,119,760 A | 6/1992 | McMillan et al. |
| 5,167,716 A | 12/1992 | Boitnott et al. |
| 5,199,603 A | 4/1993 | Prescott |
| 5,221,556 A | 6/1993 | Hawkins et al. |
| 5,242,539 A | 9/1993 | Kumihashi et al. |
| 5,243,195 A | 9/1993 | Nishi |
| 5,326,427 A | 7/1994 | Jerbic |
| 5,380,367 A | 1/1995 | Bertone |
| 5,421,893 A | 6/1995 | Perlov |
| 5,422,139 A | 6/1995 | Fischer |
| 5,518,549 A | 5/1996 | Hellwig |
| 5,595,606 A | 1/1997 | Fujikawa et al. |
| 5,616,947 A | 4/1997 | Tamura |
| 5,632,919 A | 5/1997 | MacCracken et al. |
| 5,681,779 A | 10/1997 | Pasch et al. |
| 5,695,567 A | 12/1997 | Kordina |
| 5,730,801 A | 3/1998 | Tepman |
| 5,732,744 A | 3/1998 | Barr et al. |
| 5,736,314 A | 4/1998 | Hayes et al. |
| 5,796,074 A | 8/1998 | Edelstein et al. |
| 5,836,483 A | 11/1998 | Disel |
| 5,837,320 A | 11/1998 | Hampden-Smith et al. |
| 5,855,680 A | 1/1999 | Soininen et al. |
| 5,920,798 A | 7/1999 | Higuchi et al. |
| 5,979,506 A | 11/1999 | Aarseth |
| 6,013,553 A | 1/2000 | Wallace |
| 6,015,465 A | 1/2000 | Kholodenko et al. |
| 6,035,101 A | 3/2000 | Sajoto et al. |
| 6,060,691 A | 5/2000 | Minami et al. |
| 6,074,443 A | 6/2000 | Venkatesh |
| 6,083,321 A | 7/2000 | Lei et al. |
| 6,086,677 A | 7/2000 | Umotoy et al. |
| 6,122,036 A | 9/2000 | Yamasaki et al. |
| 6,125,789 A | 10/2000 | Gupta et al. |
| 6,129,044 A | 10/2000 | Zhao et al. |
| 6,148,761 A | 11/2000 | Majewski et al. |
| 6,160,244 A | 12/2000 | Ohashi |
| 6,161,500 A | 12/2000 | Kopacz et al. |
| 6,201,999 B1 | 3/2001 | Jevtic |
| 6,274,878 B1 | 8/2001 | Li et al. |
| 6,287,965 B1 | 9/2001 | Kang et al. |
| 6,302,964 B1 | 10/2001 | Umotoy et al. |
| 6,312,525 B1 | 11/2001 | Bright et al. |
| D451,893 S | 12/2001 | Robson |
| D452,220 S | 12/2001 | Robson |
| 6,326,597 B1 | 12/2001 | Lubomirsky et al. |
| 6,342,427 B1 | 1/2002 | Choi et al. |
| 6,367,410 B1 | 4/2002 | Leahey et al. |
| 6,368,987 B1 | 4/2002 | Kopacz et al. |
| 6,383,566 B1 | 5/2002 | Zagdoun |
| 6,410,459 B2 | 6/2002 | Blalock et al. |
| 6,420,279 B1 | 7/2002 | Ono et al. |
| 6,454,860 B2 | 9/2002 | Metzner et al. |
| 6,478,872 B1 | 11/2002 | Chae et al. |
| 6,482,331 B2 | 11/2002 | Lu et al. |
| 6,483,989 B1 | 11/2002 | Okada et al. |
| 6,511,539 B1 | 1/2003 | Raaijmakers |
| 6,521,295 B1 | 2/2003 | Remington |
| 6,534,395 B2 | 3/2003 | Werkhoven et al. |
| 6,569,239 B2 | 5/2003 | Arai et al. |
| 6,579,833 B1 | 6/2003 | McNallan et al. |
| 6,590,251 B2 | 7/2003 | Kang et al. |
| 6,594,550 B1 | 7/2003 | Okrah |
| 6,598,559 B1 | 7/2003 | Vellore et al. |
| 6,627,503 B2 | 9/2003 | Ma et al. |
| 6,633,364 B2 | 10/2003 | Hayashi |
| 6,645,304 B2 | 11/2003 | Yamaguchi |
| 6,648,974 B1 | 11/2003 | Ogliari et al. |
| 6,673,196 B1 | 1/2004 | Oyabu |
| 6,682,973 B1 | 1/2004 | Paton et al. |
| 6,709,989 B2 | 3/2004 | Ramdani et al. |
| 6,710,364 B2 | 3/2004 | Guldi et al. |
| 6,734,090 B2 | 5/2004 | Agarwala et al. |
| 6,820,570 B2 | 11/2004 | Kilpela et al. |
| 6,821,910 B2 | 11/2004 | Adomaitis et al. |
| 6,824,665 B2 | 11/2004 | Shelnut et al. |
| 6,847,014 B1 | 1/2005 | Benjamin et al. |
| 6,858,524 B2 | 2/2005 | Haukka et al. |
| 6,858,547 B2 | 2/2005 | Metzner et al. |
| 6,863,019 B2 | 3/2005 | Shamouilian |
| 6,874,480 B1 | 4/2005 | Ismailov |
| 6,875,677 B1 | 4/2005 | Conley, Jr. et al. |
| 6,884,066 B2 | 4/2005 | Nguyen et al. |
| 6,884,319 B2 | 4/2005 | Kim |
| 6,889,864 B2 | 5/2005 | Lindfors et al. |
| 6,909,839 B2 | 6/2005 | Wang et al. |
| 6,930,059 B2 | 8/2005 | Conley, Jr. et al. |
| 6,935,269 B2 | 8/2005 | Lee et al. |
| 6,955,836 B2 | 10/2005 | Kumagai et al. |
| 6,972,478 B1 * | 12/2005 | Waite et al. ............. 257/627 |
| 7,045,430 B2 | 5/2006 | Ahn et al. |
| 7,053,009 B2 | 5/2006 | Conley, Jr. et al. |
| 7,071,051 B1 | 7/2006 | Jeon et al. |
| 7,115,838 B2 | 10/2006 | Kurara et al. |
| 7,122,085 B2 | 10/2006 | Shero et al. |
| 7,129,165 B2 | 10/2006 | Basol et al. |
| 7,132,360 B2 | 11/2006 | Schaeffer et al. |
| 7,135,421 B2 | 11/2006 | Ahn et al. |
| 7,147,766 B2 | 12/2006 | Uzoh et al. |
| 7,172,497 B2 | 2/2007 | Basol et al. |
| 7,192,824 B2 | 3/2007 | Ahn et al. |
| 7,192,892 B2 | 3/2007 | Ahn et al. |
| 7,195,693 B2 | 3/2007 | Cowans |
| 7,204,887 B2 | 4/2007 | Kawamura et al. |
| 7,205,247 B2 | 4/2007 | Lee et al. |
| 7,235,501 B2 | 6/2007 | Ahn et al. |
| 7,238,596 B2 | 7/2007 | Kouvetakis et al. |
| D553,104 S | 10/2007 | Oohashi et al. |
| 7,298,009 B2 * | 11/2007 | Yan et al. ............. 257/357 |
| D557,226 S | 12/2007 | Uchino et al. |
| 7,312,494 B2 | 12/2007 | Ahn et al. |
| 7,329,947 B2 | 2/2008 | Adachi et al. |
| 7,357,138 B2 | 4/2008 | Ji et al. |
| 7,393,418 B2 | 7/2008 | Yokogawa |
| 7,393,736 B2 | 7/2008 | Ahn et al. |
| 7,402,534 B2 | 7/2008 | Mahajani |
| 7,405,166 B2 | 7/2008 | Liang et al. |
| 7,405,454 B2 | 7/2008 | Ahn et al. |
| 7,414,281 B1 | 8/2008 | Fastow |
| 7,431,966 B2 | 10/2008 | Derderian et al. |
| 7,437,060 B2 | 10/2008 | Wang et al. |
| 7,442,275 B2 | 10/2008 | Cowans |
| 7,489,389 B2 | 2/2009 | Shibazaki |
| D593,969 S | 6/2009 | Li |
| 7,547,363 B2 | 6/2009 | Tomiyasu et al. |
| 7,575,968 B2 * | 8/2009 | Sadaka et al. ............. 438/199 |
| 7,589,003 B2 | 9/2009 | Kouvetakis et al. |
| 7,601,223 B2 | 10/2009 | Lindfors et al. |
| 7,601,225 B2 | 10/2009 | Tuominen et al. |
| 7,640,142 B2 | 12/2009 | Tachikawa et al. |
| 7,651,583 B2 | 1/2010 | Kent et al. |
| D609,655 S | 2/2010 | Sugimoto |
| 7,678,197 B2 | 3/2010 | Maki |
| D614,153 S | 4/2010 | Fondurulia et al. |
| 7,720,560 B2 | 5/2010 | Menser et al. |
| 7,723,648 B2 | 5/2010 | Tsukamoto et al. |
| 7,740,705 B2 | 6/2010 | Li |
| 7,780,440 B2 | 8/2010 | Shibagaki et al. |
| 7,833,353 B2 | 11/2010 | Furukawahara et al. |
| 7,838,084 B2 | 11/2010 | Derderian et al. |
| 7,851,019 B2 | 12/2010 | Tuominen et al. |
| 7,884,918 B2 | 2/2011 | Hattori |

(56) References Cited

U.S. PATENT DOCUMENTS

| | | |
|---|---|---|
| D634,719 S | 3/2011 | Yasuda et al. |
| 8,041,197 B2 | 10/2011 | Kasai et al. |
| 8,055,378 B2 | 11/2011 | Numakura |
| 8,071,451 B2 | 12/2011 | Berry |
| 8,071,452 B2 | 12/2011 | Raisanen |
| 8,072,578 B2 | 12/2011 | Yasuda |
| 8,076,230 B2 | 12/2011 | Wei |
| 8,076,237 B2 | 12/2011 | Uzoh |
| 8,082,946 B2 | 12/2011 | Laverdiere et al. |
| 8,092,604 B2 | 1/2012 | Tomiyasu et al. |
| 8,137,462 B2 | 3/2012 | Fondurulia et al. |
| 8,147,242 B2 | 4/2012 | Shibagaki et al. |
| 8,216,380 B2 | 7/2012 | White et al. |
| 8,278,176 B2 | 10/2012 | Bauer et al. |
| 8,282,769 B2 | 10/2012 | Iizuka |
| 8,287,648 B2 | 10/2012 | Reed et al. |
| 8,293,016 B2 | 10/2012 | Bahng et al. |
| 8,309,173 B2 | 11/2012 | Tuominen et al. |
| 8,323,413 B2 | 12/2012 | Son |
| 8,367,528 B2 | 2/2013 | Bauer et al. |
| 8,372,204 B2 | 2/2013 | Nakamura |
| 8,444,120 B2 | 5/2013 | Gregg et al. |
| 8,506,713 B2 | 8/2013 | Takagi |
| D691,974 S | 10/2013 | Osada et al. |
| 8,608,885 B2 | 12/2013 | Goto et al. |
| 8,683,943 B2 | 4/2014 | Onodera et al. |
| 8,711,338 B2 | 4/2014 | Liu et al. |
| D705,745 S | 5/2014 | Kurs et al. |
| 8,726,837 B2 | 5/2014 | Patalay et al. |
| 8,728,832 B2 | 5/2014 | Raisanen et al. |
| 8,802,201 B2 | 8/2014 | Raisanen et al. |
| D716,742 S | 11/2014 | Jang et al. |
| 8,877,655 B2 | 11/2014 | Shero et al. |
| 8,883,270 B2 | 11/2014 | Shero et al. |
| 8,986,456 B2 | 3/2015 | Fondurulia et al. |
| 8,993,054 B2 | 3/2015 | Jung et al. |
| 9,005,539 B2 | 4/2015 | Halpin et al. |
| 9,017,481 B1 | 4/2015 | Pettinger et al. |
| 9,018,111 B2 | 4/2015 | Milligan et al. |
| 9,021,985 B2 | 5/2015 | Alokozai et al. |
| 9,029,253 B2 | 5/2015 | Milligan et al. |
| 9,096,931 B2 | 8/2015 | Yednak et al. |
| 2001/0017103 A1 | 8/2001 | Takeshita et al. |
| 2001/0046765 A1 | 11/2001 | Cappellani et al. |
| 2002/0001974 A1 | 1/2002 | Chan |
| 2002/0011210 A1 | 1/2002 | Satoh et al. |
| 2002/0064592 A1 | 5/2002 | Datta et al. |
| 2002/0098627 A1 | 7/2002 | Pomarede et al. |
| 2002/0108670 A1 | 8/2002 | Baker et al. |
| 2002/0115252 A1 | 8/2002 | Haukka et al. |
| 2002/0172768 A1 | 11/2002 | Endo et al. |
| 2002/0187650 A1 | 12/2002 | Blalock et al. |
| 2003/0019580 A1 | 1/2003 | Strang |
| 2003/0025146 A1 | 2/2003 | Narwankar et al. |
| 2003/0040158 A1 | 2/2003 | Saitoh |
| 2003/0042419 A1 | 3/2003 | Katsumata et al. |
| 2003/0066826 A1 | 4/2003 | Lee et al. |
| 2003/0075925 A1 | 4/2003 | Lindfors et al. |
| 2003/0094133 A1 | 5/2003 | Yoshidome et al. |
| 2003/0111963 A1 | 6/2003 | Tolmachev et al. |
| 2003/0141820 A1 | 7/2003 | White et al. |
| 2003/0168001 A1 | 9/2003 | Sneh |
| 2003/0180458 A1 | 9/2003 | Sneh |
| 2003/0228772 A1 | 12/2003 | Cowans |
| 2003/0232138 A1 | 12/2003 | Tuominen et al. |
| 2004/0009679 A1 | 1/2004 | Yeo et al. |
| 2004/0013577 A1 | 1/2004 | Ganguli et al. |
| 2004/0018307 A1 | 1/2004 | Park et al. |
| 2004/0018750 A1 | 1/2004 | Sophie et al. |
| 2004/0023516 A1 | 2/2004 | Londergan et al. |
| 2004/0036129 A1 | 2/2004 | Forbes et al. |
| 2004/0077182 A1 | 4/2004 | Lim et al. |
| 2004/0101622 A1 | 5/2004 | Park et al. |
| 2004/0106249 A1 | 6/2004 | Huotari |
| 2004/0144980 A1 | 7/2004 | Ahn et al. |
| 2004/0168627 A1 | 9/2004 | Conley et al. |
| 2004/0169032 A1 | 9/2004 | Murayama et al. |
| 2004/0198069 A1 | 10/2004 | Metzner et al. |
| 2004/0200499 A1 | 10/2004 | Harvey et al. |
| 2004/0219793 A1 | 11/2004 | Hishiya et al. |
| 2004/0221807 A1 | 11/2004 | Verghese et al. |
| 2004/0266011 A1 | 12/2004 | Lee et al. |
| 2005/0008799 A1 | 1/2005 | Tomiyasu et al. |
| 2005/0019026 A1 | 1/2005 | Wang et al. |
| 2005/0020071 A1 | 1/2005 | Sonobe et al. |
| 2005/0023624 A1 | 2/2005 | Ahn et al. |
| 2005/0054228 A1 | 3/2005 | March |
| 2005/0066893 A1 | 3/2005 | Soininen |
| 2005/0070123 A1 | 3/2005 | Hirano |
| 2005/0072357 A1 | 4/2005 | Shero et al. |
| 2005/0092249 A1 | 5/2005 | Kilpela et al. |
| 2005/0100669 A1 | 5/2005 | Kools et al. |
| 2005/0106893 A1 | 5/2005 | Wilk |
| 2005/0110069 A1 | 5/2005 | Kil et al. |
| 2005/0123690 A1 | 6/2005 | Derderian et al. |
| 2005/0173003 A1 | 8/2005 | Laverdiere et al. |
| 2005/0187647 A1 | 8/2005 | Wang et al. |
| 2005/0212119 A1 | 9/2005 | Shero |
| 2005/0214457 A1 | 9/2005 | Schmitt et al. |
| 2005/0214458 A1 | 9/2005 | Meiere |
| 2005/0218462 A1 | 10/2005 | Ahn et al. |
| 2005/0229848 A1 | 10/2005 | Shinriki |
| 2005/0229972 A1 | 10/2005 | Hoshi et al. |
| 2005/0241176 A1 | 11/2005 | Shero et al. |
| 2005/0263075 A1 | 12/2005 | Wang et al. |
| 2005/0271813 A1 | 12/2005 | Kher et al. |
| 2005/0282101 A1 | 12/2005 | Adachi |
| 2005/0287725 A1 | 12/2005 | Kitagawa |
| 2006/0013946 A1 | 1/2006 | Park et al. |
| 2006/0014384 A1 | 1/2006 | Lee et al. |
| 2006/0019033 A1 | 1/2006 | Muthukrishnan et al. |
| 2006/0024439 A2 | 2/2006 | Tuominen et al. |
| 2006/0046518 A1 | 3/2006 | Hill et al. |
| 2006/0051925 A1 | 3/2006 | Ahn et al. |
| 2006/0060930 A1 | 3/2006 | Metz et al. |
| 2006/0062910 A1 | 3/2006 | Meiere |
| 2006/0063346 A1 | 3/2006 | Lee et al. |
| 2006/0068125 A1 | 3/2006 | Radhakrishnan |
| 2006/0110934 A1 | 5/2006 | Fukuchi |
| 2006/0113675 A1 | 6/2006 | Chang et al. |
| 2006/0128168 A1 | 6/2006 | Ahn et al. |
| 2006/0148180 A1 | 7/2006 | Ahn et al. |
| 2006/0163612 A1 | 7/2006 | Kouvetakis et al. |
| 2006/0193979 A1 | 8/2006 | Meiere et al. |
| 2006/0208215 A1 | 9/2006 | Metzner et al. |
| 2006/0213439 A1 | 9/2006 | Ishizaka |
| 2006/0223301 A1 | 10/2006 | Vanhaelemeersch et al. |
| 2006/0226117 A1 | 10/2006 | Bertram et al. |
| 2006/0228888 A1 | 10/2006 | Lee et al. |
| 2006/0240574 A1 | 10/2006 | Yoshie |
| 2006/0257563 A1 | 11/2006 | Doh et al. |
| 2006/0257584 A1 | 11/2006 | Derderian et al. |
| 2006/0258078 A1 | 11/2006 | Lee et al. |
| 2006/0266289 A1 | 11/2006 | Verghese et al. |
| 2007/0010072 A1 | 1/2007 | Bailey et al. |
| 2007/0020953 A1 | 1/2007 | Tsai et al. |
| 2007/0022954 A1 | 2/2007 | Iizuka et al. |
| 2007/0028842 A1 | 2/2007 | Inagawa et al. |
| 2007/0031598 A1 | 2/2007 | Okuyama et al. |
| 2007/0031599 A1 | 2/2007 | Gschwandtner et al. |
| 2007/0037412 A1 | 2/2007 | Dip et al. |
| 2007/0042117 A1 | 2/2007 | Kupurao et al. |
| 2007/0049053 A1 | 3/2007 | Mahajani |
| 2007/0059948 A1 | 3/2007 | Metzner et al. |
| 2007/0065578 A1 | 3/2007 | McDougall |
| 2007/0066010 A1 | 3/2007 | Ando |
| 2007/0077355 A1 | 4/2007 | Chacin et al. |
| 2007/0084405 A1 | 4/2007 | Kim |
| 2007/0096194 A1 | 5/2007 | Streck et al. |
| 2007/0116873 A1 | 5/2007 | Li et al. |
| 2007/0134942 A1 | 6/2007 | Ahn et al. |
| 2007/0146621 A1 | 6/2007 | Yeom |
| 2007/0155138 A1 | 7/2007 | Tomasini et al. |
| 2007/0163440 A1 | 7/2007 | Kim et al. |

(56) References Cited

U.S. PATENT DOCUMENTS

| | | |
|---|---|---|
| 2007/0166457 A1 | 7/2007 | Yamoto et al. |
| 2007/0175397 A1 | 8/2007 | Tomiyasu et al. |
| 2007/0209590 A1 | 9/2007 | Li |
| 2007/0232501 A1 | 10/2007 | Tonomura |
| 2007/0237697 A1 | 10/2007 | Clark |
| 2007/0249131 A1 | 10/2007 | Allen et al. |
| 2007/0252244 A1 | 11/2007 | Srividya et al. |
| 2007/0264807 A1 | 11/2007 | Leone et al. |
| 2008/0006208 A1 | 1/2008 | Ueno et al. |
| 2008/0029790 A1 | 2/2008 | Ahn et al. |
| 2008/0054332 A1 | 3/2008 | Kim et al. |
| 2008/0057659 A1 | 3/2008 | Forbes et al. |
| 2008/0075881 A1 | 3/2008 | Won et al. |
| 2008/0085226 A1 | 4/2008 | Fondurulia et al. |
| 2008/0113096 A1 | 5/2008 | Mahajani |
| 2008/0113097 A1 | 5/2008 | Mahajani et al. |
| 2008/0124908 A1 | 5/2008 | Forbes et al. |
| 2008/0149031 A1 | 6/2008 | Chu et al. |
| 2008/0176375 A1 | 7/2008 | Erben et al. |
| 2008/0216077 A1 | 9/2008 | Emani et al. |
| 2008/0224240 A1 | 9/2008 | Ahn et al. |
| 2008/0233288 A1 | 9/2008 | Clark |
| 2008/0237572 A1 | 10/2008 | Chui et al. |
| 2008/0248310 A1 | 10/2008 | Kim et al. |
| 2008/0261413 A1 | 10/2008 | Mahajani |
| 2008/0282970 A1 | 11/2008 | Heys et al. |
| 2008/0315292 A1 | 12/2008 | Ji et al. |
| 2009/0000550 A1 | 1/2009 | Tran et al. |
| 2009/0011608 A1 | 1/2009 | Nabatame |
| 2009/0020072 A1 | 1/2009 | Mizunaga et al. |
| 2009/0029564 A1 | 1/2009 | Yamashita et al. |
| 2009/0035947 A1 | 2/2009 | Horii |
| 2009/0061644 A1 | 3/2009 | Chiang et al. |
| 2009/0085156 A1 | 4/2009 | Dewey et al. |
| 2009/0093094 A1 | 4/2009 | Ye et al. |
| 2009/0095221 A1 | 4/2009 | Tam et al. |
| 2009/0107404 A1 | 4/2009 | Ogliari et al. |
| 2009/0136668 A1 | 5/2009 | Gregg et al. |
| 2009/0139657 A1 | 6/2009 | Lee et al. |
| 2009/0211523 A1 | 8/2009 | Kuppurao et al. |
| 2009/0211525 A1 | 8/2009 | Sarigiannis et al. |
| 2009/0239386 A1 | 9/2009 | Suzaki et al. |
| 2009/0242957 A1 | 10/2009 | Ma et al. |
| 2009/0246374 A1 | 10/2009 | Vukovic |
| 2009/0261331 A1 | 10/2009 | Yang et al. |
| 2009/0277510 A1 | 11/2009 | Shikata |
| 2009/0283041 A1 | 11/2009 | Tomiyasu et al. |
| 2009/0289300 A1 | 11/2009 | Sasaki et al. |
| 2010/0024727 A1 | 2/2010 | Kim et al. |
| 2010/0025796 A1 | 2/2010 | Dabiran |
| 2010/0055312 A1 | 3/2010 | Kato et al. |
| 2010/0075507 A1 | 3/2010 | Chang et al. |
| 2010/0102417 A1 | 4/2010 | Ganguli et al. |
| 2010/0124610 A1 | 5/2010 | Aikawa et al. |
| 2010/0130017 A1 | 5/2010 | Luo et al. |
| 2010/0162752 A1 | 7/2010 | Tabata et al. |
| 2010/0170441 A1 | 7/2010 | Won et al. |
| 2010/0193501 A1 | 8/2010 | Zucker et al. |
| 2010/0230051 A1 | 9/2010 | Iizuka |
| 2010/0255198 A1 | 10/2010 | Cleary et al. |
| 2010/0275846 A1 | 11/2010 | Kitagawa |
| 2010/0294199 A1 | 11/2010 | Tran et al. |
| 2010/0307415 A1 | 12/2010 | Shero et al. |
| 2010/0322604 A1 | 12/2010 | Fondurulia et al. |
| 2011/0000619 A1 | 1/2011 | Suh |
| 2011/0061810 A1 | 3/2011 | Ganguly et al. |
| 2011/0070380 A1 | 3/2011 | Shero et al. |
| 2011/0089469 A1 | 4/2011 | Merckling |
| 2011/0097901 A1 | 4/2011 | Banna et al. |
| 2011/0108194 A1 | 5/2011 | Yoshioka et al. |
| 2011/0236600 A1 | 9/2011 | Fox et al. |
| 2011/0239936 A1 | 10/2011 | Suzaki et al. |
| 2011/0254052 A1 | 10/2011 | Kouvetakis |
| 2011/0256734 A1 | 10/2011 | Hausmann et al. |
| 2011/0275166 A1 | 11/2011 | Shero et al. |
| 2011/0308460 A1 | 12/2011 | Hong et al. |
| 2012/0024479 A1 | 2/2012 | Palagashvili et al. |
| 2012/0070136 A1 | 3/2012 | Koelmel et al. |
| 2012/0070997 A1 | 3/2012 | Larson |
| 2012/0090704 A1 | 4/2012 | Laverdiere et al. |
| 2012/0098107 A1 | 4/2012 | Raisanen et al. |
| 2012/0114877 A1 | 5/2012 | Lee |
| 2012/0156108 A1 | 6/2012 | Fondurulia et al. |
| 2012/0160172 A1 | 6/2012 | Wamura et al. |
| 2012/0240858 A1 | 9/2012 | Taniyama et al. |
| 2012/0270393 A1 | 10/2012 | Pore et al. |
| 2012/0289053 A1 | 11/2012 | Holland et al. |
| 2012/0295427 A1 | 11/2012 | Bauer |
| 2012/0304935 A1 | 12/2012 | Oosterlaken et al. |
| 2012/0318334 A1 | 12/2012 | Bedell et al. |
| 2012/0321786 A1 | 12/2012 | Satitpunwaycha et al. |
| 2013/0023129 A1 | 1/2013 | Reed |
| 2013/0104988 A1 | 5/2013 | Yednak et al. |
| 2013/0104992 A1 | 5/2013 | Yednak et al. |
| 2013/0115383 A1 | 5/2013 | Lu et al. |
| 2013/0126515 A1 | 5/2013 | Shero et al. |
| 2013/0129577 A1 | 5/2013 | Halpin et al. |
| 2013/0230814 A1 | 9/2013 | Dunn et al. |
| 2013/0256838 A1 | 10/2013 | Sanchez et al. |
| 2013/0264659 A1 | 10/2013 | Jung |
| 2013/0292676 A1 | 11/2013 | Milligan et al. |
| 2013/0292807 A1 | 11/2013 | Raisanen et al. |
| 2013/0330911 A1 | 12/2013 | Huang et al. |
| 2014/0000843 A1 | 1/2014 | Dunn et al. |
| 2014/0014644 A1 | 1/2014 | Akiba et al. |
| 2014/0020619 A1 | 1/2014 | Vincent et al. |
| 2014/0027884 A1 | 1/2014 | Fang et al. |
| 2014/0036274 A1 | 2/2014 | Marquardt et al. |
| 2014/0060147 A1 | 3/2014 | Sarin et al. |
| 2014/0067110 A1 | 3/2014 | Lawson et al. |
| 2014/0073143 A1 | 3/2014 | Alokozai et al. |
| 2014/0077240 A1 | 3/2014 | Roucka et al. |
| 2014/0084341 A1 | 3/2014 | Weeks |
| 2014/0087544 A1 | 3/2014 | Tolle |
| 2014/0103145 A1 | 4/2014 | White et al. |
| 2014/0120487 A1 | 5/2014 | Kaneko |
| 2014/0159170 A1 | 6/2014 | Raisanen et al. |
| 2014/0175054 A1 | 6/2014 | Carlson et al. |
| 2014/0217065 A1 | 8/2014 | Winkler et al. |
| 2014/0220247 A1 | 8/2014 | Haukka et al. |
| 2014/0225065 A1 | 8/2014 | Rachmady et al. |
| 2014/0251953 A1 | 9/2014 | Winkler et al. |
| 2014/0251954 A1 | 9/2014 | Winkler et al. |
| 2014/0346650 A1 | 11/2014 | Raisanen et al. |
| 2015/0004316 A1 | 1/2015 | Thompson et al. |
| 2015/0014632 A1 | 1/2015 | Kim et al. |
| 2015/0024609 A1 | 1/2015 | Milligan et al. |
| 2015/0048485 A1 | 2/2015 | Tolle |
| 2015/0091057 A1 | 4/2015 | Xie et al. |
| 2015/0096973 A1 | 4/2015 | Dunn et al. |
| 2015/0132212 A1 | 5/2015 | Winkler et al. |
| 2015/0140210 A1 | 5/2015 | Jung et al. |
| 2015/0147877 A1 | 5/2015 | Jung |
| 2015/0167159 A1 | 6/2015 | Halpin et al. |
| 2015/0184291 A1 | 7/2015 | Alokozai et al. |
| 2015/0187568 A1 | 7/2015 | Pettinger et al. |

FOREIGN PATENT DOCUMENTS

| | | |
|---|---|---|
| CN | 101522943 | 9/2009 |
| CN | 101423937 | 9/2011 |
| EP | 2036600 | 3/2009 |
| JP | 07283149 | 10/1995 |
| JP | 08335558 | 12/1996 |
| JP | 2001342570 | 12/2001 |
| JP | 2004014952 | 1/2004 |
| JP | 2004091848 | 3/2004 |
| JP | 2004538374 | 12/2004 |
| JP | 2005507030 | 3/2005 |
| JP | 2006186271 | 7/2006 |
| JP | 2008527748 | 7/2008 |
| TW | I226380 | 1/2005 |

(56) References Cited

FOREIGN PATENT DOCUMENTS

| TW | 200701301 | 1/2007 |
|----|-----------|--------|
| WO | 2006/056091 | 6/2006 |
| WO | 2006/078666 | 7/2006 |

OTHER PUBLICATIONS

USPTO; Final Office Action dated Jan. 29, 2015 in U.S. Appl. No. 13/283,408.
USPTO; Notice of Allowance dated Feb. 11, 2015 in U.S. Appl. No. 13/284,642.
USPTO; Final Office Action dated Jan. 16, 2015 in U.S. Appl. No. 13/411,271.
USPTO; Final Office Action dated Feb. 12, 2015 in U.S. Appl. No. 13/563,066.
USPTO; Non-Final Office Action dated Feb. 12, 2015 in U.S. Appl. No. 13/597,108.
USPTO; Notice of Allowance dated Feb. 26, 2015 in U.S. Appl. No. 13/677,151.
USPTO; Notice of Allowance dated Jan. 20, 2015 in U.S. Appl. No. 13/941,134.
USPTO; Non-Final Office Action dated Feb. 12, 2015 in U.S. Appl. No. 14/457,058.
USPTO; Non-Final Office Action dated Jan. 16, 2015 in U.S. Appl. No. 14/563,044.
Chinese Patent Office; Office Action dated Jan. 12, 2015 in Application No. 201080015699.9.
Chinese Patent Office; Notice on the Third Office Action dated Feb. 9, 2015 in Application No. 201110155056.
Japanese Patent Office; Office Action dated Dec. 1, 2014 in Application No. 2012-504786.
Taiwan Patent Office; Office Action dated Dec. 30, 2014 in Application No. 099114330.
Taiwan Patent Office; Office Action dated Dec. 19, 2014 in Application No. 099127063.
USPTO; Final Office Action dated Jul. 14, 2014 in U.S. Appl. No. 12/754,223.
USPTO; Notice of Allowance dated Jul. 3, 2014 in U.S. Appl. No. 13/102,980.
USPTO; Office Action dated Jun. 3, 2014 in U.S. Appl. No. 12/854,818.
USPTO; Non-Final Office Action dated Jul. 2, 2014 in U.S. Appl. No. 13/283,408.
USPTO; Non-Final Office Action dated Jul. 30, 2014 in U.S. Appl. No. 13/284,642.
USPTO; Office Action dated Jul. 31, 2014 in U.S. Appl. No. 13/411,271.
USPTO Final Office Action dated Jul. 8, 2014 in U.S. Appl. No. 13/439,528.
USPTO; Final Office Action dated Jun. 18, 2014 in U.S. Appl. No. 13/535,214.
USPTO; Non-Final Office Action dated Aug. 8, 2014 in U.S. Appl. No. 13/563,066.
USPTO; Non-Final Office Action dated Jul. 10, 2014 in U.S. Appl. No. 13/612,538.
USPTO; Non-Final Office Action dated Jun. 2, 2014 in U.S. Appl. No. 13/677,151.
USPTO; Notice of Allowance dated Aug. 13, 2014 in U.S. Appl. No. 13/784,362.
USPTO; Restriction Requirement dated Jun. 26, 2014 in U.S. Appl. No. 13/874,708.
USPTO; Non-Final Office Action dated May 29, 2014 in U.S. Appl. No. 14/183,187.
Chinese Patent Office; Notice on the Third Office Action dated Jul. 1, 2014 in Application No. 201080036764.6.
Taiwan Patent Office; Office Action dated Jul. 4, 2014 in Application No. 099110511.
USPTO; Office Action dated Aug. 27, 2010 in U.S. Appl. No. 12/118,596.
USPTO; Office Action dated Feb. 15, 2011 in U.S. Appl. No. 12/118,596.
USPTO; Notice of Allowance dated Aug. 4, 2011 in U.S. Appl. No. 12/118,596.
USPTO; Notice of Allowance dated Jun. 16, 2011 in U.S. Appl. No. 12/430,751.
USPTO; Notice of Allowance dated Jul. 27, 2011 in U.S. Appl. No. 12/430,751.
USPTO; Restriction Requirement dated Jan. 15, 2013 in U.S. Appl. No. 12/754,223.
USPTO; Office Action dated Feb. 26, 2013 in U.S. Appl. No. 12/754,223.
USPTO; Final Office Action dated Jun. 28, 2013 in U.S. Appl. No. 12/754,223.
USPTO; Office Action dated Feb. 25, 2014 in U.S. Appl. No. 12/754,223.
USPTO; Office Action dated Apr. 23, 2013 in U.S. Appl. No. 12/763,037.
USPTO; Final Office Action dated Oct. 21, 2013 in U.S. Appl. No. 12/763,037.
USPTO; Restriction Requirement dated Sep. 25, 2012 in U.S. Appl. No. 12/854,818.
USPTO; Office Action dated Dec. 6, 2012 in U.S. Appl. No. 12/854,818.
USPTO; Final Office Action dated Mar. 13, 2013 in U.S. Appl. No. 12/854,818.
USPTO; Office Action dated Aug. 30, 2013 in U.S. Appl. No. 12/854,818.
USPTO; Final Office Action dated Mar. 26, 2014 in U.S. Appl. No. 12/854,818.
USPTO; Restriction Requirement dated May 8, 2013 in U.S. Appl. No. 13/102,980.
USPTO; Office Action dated Oct. 7, 2013 in U.S. Appl. No. 13/102,980.
USPTO; Final Office Action dated Mar. 25, 2014 in U.S. Appl. No. 13/102,980.
USPTO; Restriction Requirement dated Dec. 16, 2013 in U.S. Appl. No. 13/284,642.
USPTO; Restriction Requirement dated Apr. 21, 2014 in U.S. Appl. No. 13/284,642.
USPTO; Office Action dated Jan. 28, 2014 in U.S. Appl. No. 13/312,591.
USPTO; Final Office Action dated May 14, 2014 in U.S. Appl. No. 13/312,591.
USPTO; Office Action dated Jan. 10, 2013 in U.S. Appl. No. 13/339,609.
USPTO; Office Action dated Feb. 11, 2013 in U.S. Appl. No. 13/339,609.
USPTO; Final Office Action dated May 17, 2013 in U.S. Appl. No. 13/339,609.
USPTO; Office Action dated Aug. 29, 2013 in U.S. Appl. No. 13/339,609.
USPTO; Final Office Action dated Dec. 18, 2013 in U.S. Appl. No. 13/339,609.
USPTO; Notice of Allowance dated Apr. 7, 2014 in U.S. Appl. No. 13/339,609.
USPTO; Office Action dated Feb. 13, 2014 in U.S. Appl. No. 13/411,271.
USPTO; Restriction Requirement dated Oct. 29, 2013 in U.S. Appl. No. 13/439,258.
USPTO; Office Action dated Mar. 24, 2014 in U.S. Appl. No. 13/439,258.
USPTO; Office Action dated May 23, 2013 in U.S. Appl. No. 13/465,340.
USPTO; Final Office Action dated Oct. 30, 2013 in U.S. Appl. No. 13/465,340.
USPTO; Notice of Allowance dated Feb. 12, 2014 in U.S. Appl. No. 13/465,340.
USPTO; Office Action dated Dec. 20, 2013 in U.S. Appl. No. 13/535,214.
USPTO; Office Action dated Nov. 15, 2013 in U.S. Appl. No. 13/612,538.

(56) References Cited

OTHER PUBLICATIONS

USPTO; Office Action dated Apr. 24, 2014 in U.S. Appl. No. 13/784,362.
USPTO; Restriction Requirement dated May 8, 2014 in U.S. Appl. No. 13/791,246.
PCT; International Search report and Written Opinion dated Nov. 12, 2010 in Application No. PCT/US2010/030126.
PCT; International Search report and Written Opinion dated Jan. 12, 2011 in Application No. PCT/US2010/045368.
PCT; International Search report and Written Opinion dated Feb. 6, 2013 in Application No. PCT/US2012/065343.
PCT; International Search report and Written Opinion dated Feb. 13, 2013 in Application No. PCT/US2012/065347.
Chinese Patent Office; Office Action dated Jan. 10, 2013 in Serial No. 201080015699.9.
Chinese Patent Office; Notice on the First Office Action dated May 24, 2013 in Serial No. 201080036764.6.
Chinese Patent Office; Notice on the Second Office Action dated Jan. 2, 2014 in Serial No. 201080036764.6.
Japanese Patent Office; Office Action dated Jan. 25, 2014 in Serial No. 2012-504786.
Chang et al. Small-Subthreshold-Swing and Low-Voltage Flexible Organic Thin-Film Transistors Which Use HfLaO as the Gate Dielectric; IEEE Electron Device Letters; Feb. 2009; 133-135; vol. 30, No. 2; IEEE Electron Device Society.
Maeng et al. Electrical properties of atomic layer disposition HfO2 and HfOxNy on Si substrates with various crystal orientations, Journal of the Electrochemical Society, Apr. 2008, p. H267-H271, vol. 155, No. 4, Department of Materials Science and Engineering, Pohang University of Science and Technology, Pohang, Korea.
Novaro et al. Theoretical Study on a Reaction Pathway of Ziegler-Natta-Type Catalysis, J. Chem. Phys. 68(5), Mar. 1, 1978 p. 2337-2351.
USPTO; Office Action dated Oct. 8, 2014 in U.S. Appl. No. 12/763,037.
USPTO; Non-Final Office Action dated Sep. 17, 2014 in U.S. Appl. No. 13/187,300.
USPTO; Non-Final Office Action dated Nov. 26, 2014 in U.S. Appl. No. 13/312,591.
UPPTO; Notice of Allowance dated Oct. 21, 2014 in U.S. Appl. No. 13/439,528.
USPTO; Notice of Allowance dated Oct. 23, 2014 in U.S. Appl. No. 13/535,214.
USPTO; Non-Final Office Action dated Oct. 15, 2014 in U.S. Appl. No. 13/597,043.
USPTO; Final Office Action dated Nov. 14, 2014 in U.S. Appl. No. 13/677,151.
USPTO; Non-Final Office Action dated Oct. 9, 2014 in U.S. Appl. No. 13/874,708.
USPTO; Non-Final Office Action dated Sep. 19, 2014 in U.S. Appl. No. 13/791,246.
USPTO; Non-Final Office Action dated Sep. 12, 2014 in U.S. Appl. No. 13/941,134.
USPTO; Restriction Requirement dated Sep. 16, 2014 in U.S. Appl. No. 13/948,055.
USPTO; Non-Final Office Action dated Oct. 30, 2014 in U.S. Appl. No. 13/948,055.
USPTO; Final Office Action dated Nov. 7, 2014 in U.S. Appl. No. 14/183,187.
Chinese Patent Office; Notice on the Second Office Action dated Sep. 16, 2014 in Application No. 201110155056.
Koutsokeras et al. Texture and Microstructure Evolution in Single-Phase TixTa1-xN Alloys of Rocksalt Structure. Journal of Applied Physics, 110, pp. 043535-1-043535-6, (2011).
USPTO; Final Office Action dated Apr. 15, 2015 in U.S. Appl. No. 13/187,300.
USPTO; Final Office Action dated Mar. 20, 2015 in U.S. Appl. No. 13/312,591.
USPTO; Notice of Allowance dated May 14, 2015 in U.S. Appl. No. 13/312,591.
USPTO; Final Office Action dated Mar. 13, 2015 in U.S. Appl. No. 13/597,043.
USPTO; Final Office Action dated Jun. 1, 2015 in U.S. Appl. No. 13/597,108.
USPTO; Non-Final Office Action dated May 28, 2015 in U.S. Appl. No. 13/651,144.
USPTO; Non-Final Office Action dated Apr. 3, 2015 in U.S. Appl. No. 13/677,133.
USPTO; Final Office Action dated Mar. 25, 2015 in U.S. Appl. No. 13/791,246.
USPTO; Notice of Allowance dated Mar. 10, 2015 in U.S. Appl. No. 13/874,708.
USPTO; Restriction Requirement dated Apr. 30, 2015 in U.S. Appl. No. 13/941,216.
USPTO; Non-Final Office Action dated Apr. 7, 2015 in U.S. Appl. No. 14/018,345.
USPTO; Non-Final Office Action dated Apr. 28, 2015 in U.S. Appl. No. 14/040,196.
USPTO; Non-Final Office Action dated Mar. 19, 2015 in U.S. Appl. No. 14/079,302.
USPTO; Non-Final Office Action dated Mar. 19, 2015 in U.S. Appl. No. 14/166,462.
USPTO; Non-Final Office Action dated Mar. 16, 2015 in U.S. Appl. No. 14/183,187.
USPTO; Non-Final Office Action dated Mar. 16, 2015 in U.S. Appl. No. 29/447,298.
Bearzotti, et al., "Fast Humidity Response of a Metal Halide-Doped Novel Polymer," Sensors and Actuators B, 7, pp. 451-454, (1992).
Crowell, "Chemical methods of thin film deposition: Chemical vapor deposition, atomic layer deposition, and related technologies," Journal of Vacuum Science & Technology A 21.5, (2003): S88-S95.
Varma, et al., "Effect of Metal Halides on Thermal, Mechanical, and Electrical Properties of Polypyromelitimide Films," Journal of Applied Polymer Science, vol. 32, pp. 3987-4000, (1986).
USPTO; Final Office Action dated Aug. 12, 2015 in U.S. Appl. No. 12/754,223.
USPTO; Non-Final Office Action dated Jun. 17, 2015 in U.S. Appl. No. 13/283,408.
USPTO; Notice of Allowance dated Jun. 12, 2015 in U.S. Appl. No. 13/563,066.
USPTO; Notice of Allowance dated Jul. 16, 2015 in U.S. Appl. No. 13/563,066.
USPTO; Notice of Allowance dated Aug. 4, 2015 in U.S. Appl. No. 13/677,133.
USPTO; Non-Final Office Action dated Jul. 30, 2015 in U.S. Appl. No. 13/941,216.
USPTO; Non-Final Office Action dated Jun. 29, 2015 in U.S. Appl. No. 13/966,782.
USPTO; Final Office Action dated Jul. 14, 2015 in U.S. Appl. No. 14/457,058.
USPTO; Notice of Allowance dated Jul. 6, 2015 in U.S. Appl. No. 29/447,298.

\* cited by examiner

SEMICONDUCTOR STRUCTURE AND DEVICE AND METHODS OF FORMING SAME USING SELECTIVE EPITAXIAL PROCESS

FIELD OF INVENTION

The present disclosure generally relates to semiconductor structures and devices. More particularly, the disclosure relates to semiconductor structures and devices including one or more layers formed using a selective epitaxial deposition process.

BACKGROUND OF THE DISCLOSURE

Multi-gate semiconductor devices, including and sometimes generally referred to as FinFET devices, have recently attracted more attention, because the devices offer higher performance per unit of power compared to similar, single gate/planar devices. With traditional metal oxide semiconductor (MOS) devices, as device geometries continue to shrink in an effort to increase performance of the device, short channel effects, such as off-state leakage current, increase. The leakage, in turn, increases idle power requirements for the device.

FinFET devices include a gate structure that can mitigate leakage current. The reduced leakage current not only reduces power consumption when the device is in an off state, but can also reduce a threshold voltage of the device, which can lead to increased switching speeds and reduced operating power consumption.

FinFET devices may desirably include germanium in the channel region of the device. Inclusion of germanium in a channel region can increase the mobility of charge carriers, which in turn, leads to increased device performance. Unfortunately, inclusion of germanium in the channel region has proven to be challenging to integrate into complimentary MOS (CMOS) devices. Various approaches for forming CMOS FinFET devices include the use of aspect ratio trapping to reduce a number of defects along a shallow trench isolation structure of the device. However, such processes generally require filling a narrow trench (e.g., less than 10 nm in width) with epitaxial material, which is difficult. In addition, buffer recess control in such devices can be less than desirable, resulting in channel height uniformity that is less than desirable. Accordingly, improved structures, devices, and methods of forming the structures and devices, which are relatively easy to fabricate with relatively uniform channel height are desired.

SUMMARY OF THE DISCLOSURE

Various embodiments of the present disclosure relate to semiconductor structure and devices and to methods of forming the structures and devices. More particularly, the disclosure relates to multi-gate or FinFET structures and devices and to methods of forming the same. While the ways in which various embodiments of the disclosure address the drawbacks of the prior art methods are discussed in more detail below, in general, the disclosure provides FinFET-structures and devices that can include both n-channel MOS (NMOS) and p-channel MOS (PMOS) devices to form CMOS structures and devices.

In accordance with exemplary embodiments of the disclosure, a method of forming a semiconductor structure includes the steps of providing a substrate comprising silicon, forming a buffer layer comprising $Si_{1-x}Ge_x$, where x ranges from 0 to about 0.8 or 0 to about 0.5, overlying the substrate, using a first selective epitaxial process to form a first feature comprising silicon—e.g., $Si_{1-z}Ge_z$, where z ranges from 0 to about 0.7 (e.g., for an NMOS device)—overlying the buffer layer on a surface, and using a second selective epitaxial process to form a second feature comprising $Si_{1-y}Ge_y$, where y ranges from about 0.1 to 1 (e.g., for a PMOS device), on the surface. As set forth in more detail below, structures formed in accordance with these embodiments are suitable for forming CMOS FinFET devices and structures on a substrate. In accordance with various aspects of these embodiments, a first feature or region is formed overlying a p well region in the buffer layer and the second feature or region is formed overlying an n well region in the buffer layer. In accordance with further aspects of these embodiments, the first features are formed by depositing a hard mask, patterning the hard mask, etching the hard mask using a suitable etchant to form openings in the hard mask, and forming the feature using selective epitaxial techniques. After the first features are formed, the hard mask is removed using a suitable etchant. The second features may be formed using the same or similar techniques. In accordance with further aspects of these embodiments, the hard mask is formed of silicon oxide or silicon nitride material. In accordance with yet further aspects, a step of forming a hard mask for the second features includes forming a hard mask that overhangs the first feature on at least one side, such that a gap is formed between the first feature and the second feature—e.g., a space may range from about 2 nm-50 nm or about 10 nm is formed between first and second features of a structure that forms part of a device. Exemplary methods may also include forming fins or protrusions using the buffer layer and the first and second features. In these cases, a method additionally includes the steps of etching the first feature and the second feature to form one or more fins comprising silicon and one or more fins comprising $Si_{1-y}Ge_y$, where y ranges from about 0.1 to 1 (e.g., for a PMOS device) or $Si_{1-z}Ge_z$, where z ranges from 0 to about 0.7 (e.g., for an NMOS device), depositing insulating material at a temperature of less than about 400° C., and removing a portion of the insulating material. In accordance with various aspects of these embodiments, the insulating material is silicon oxide and the precursors used to deposit the insulating material include $H_2Si[N(C_2H_5)_2]_2$ and an $O_2$ plasma.

In accordance with additional embodiments of the disclosure, a semiconductor structure includes a substrate comprising silicon, a buffer layer comprising $Si_{1-x}Ge_x$, where x ranges from 0 to about 0.8 or 0 to about 0.5, overlying the substrate, a p well region formed within the buffer layer, an n well region formed within the buffer layer, one or more fin structures formed using the p well region and a layer comprising silicon (e.g., $Si_{1-z}Ge_z$, where z ranges from 0 to about 0.7), one or more fin structures formed using the n well region and a layer comprising $Si_{1-y}Ge_y$, where y ranges from about 0.1 to 1, and an insulating layer formed overlying a portion of the buffer layer. The structures described herein can be formed using the methods described above. For example, one or more of the insulating layers may be formed at a temperature of less than about 400° C., such as for example, using $H_2Si[N(C_2H_5)_2]_2$ and an $O_2$ plasma.

In accordance with additional embodiments of the disclosure, a semiconductor structure includes a substrate comprising silicon, a buffer layer comprising $Si_{1-x}Ge_x$, where x ranges from 0 to about 0.8 or 0 to about 0.5, overlying the substrate, a first feature comprising silicon (e.g., $Si_{1-z}Ge_z$, where z ranges from 0 to about 0.7) overlying the buffer layer, a second feature comprising $Si_{1-y}Ge_y$, where y ranges from about 0.1 to 1 overlying the buffer layer and on the same surface as the first feature. In accordance with exemplary aspects of these embodiments, a length of—e.g. about 2-50 or about 10 or less than 50 nm separates the first feature and the second feature. These structures may be formed using methods described herein.

In accordance with yet additional exemplary embodiments of the disclosure, a CMOS device includes a substrate comprising silicon, a buffer layer comprising $Si_{1-x}Ge_x$, where x ranges from 0 to about 0.8 or 0 to about 0.5, overlying the substrate, a p well region formed within the buffer layer, an n well region formed within the buffer layer, one or more fin structures formed using the p well region and a layer comprising silicon (e.g., $Si_{1-z}Ge_z$, where z ranges from 0 to about 0.7), one or more fin structures formed using the n well region and a layer comprising $Si1-yGey$, where y ranges from about 0.1 to 1, and an insulating layer formed overlying a portion of the buffer layer.

Exemplary methods to form a CMOS device include a method of forming a semiconductor structure as described herein. Methods to form CMOS device may suitably include additional deposition, etch, and other processes typically used to form such devices.

BRIEF DESCRIPTION OF THE DRAWING FIGURES

A more complete understanding of exemplary embodiments of the present disclosure may be derived by referring to the detailed description and claims when considered in connection with the following illustrative figures.

It will be appreciated that elements in the figures are illustrated for simplicity and clarity and have not necessarily been drawn to scale. For example, the dimensions of some of the elements in the figures may be exaggerated relative to other elements to help to improve understanding of illustrated embodiments of the present disclosure.

DETAILED DESCRIPTION OF EXEMPLARY EMBODIMENTS OF THE DISCLOSURE

The description of exemplary embodiments of methods, structures, and devices provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features.

The present disclosure relates, generally, to semiconductor devices and structures and to methods of forming the devices as structures. As set forth in more detail below, the structure may be used to form devices including multiple gates, such as FinFET devices, having germanium in the channel region.

Figure 10:
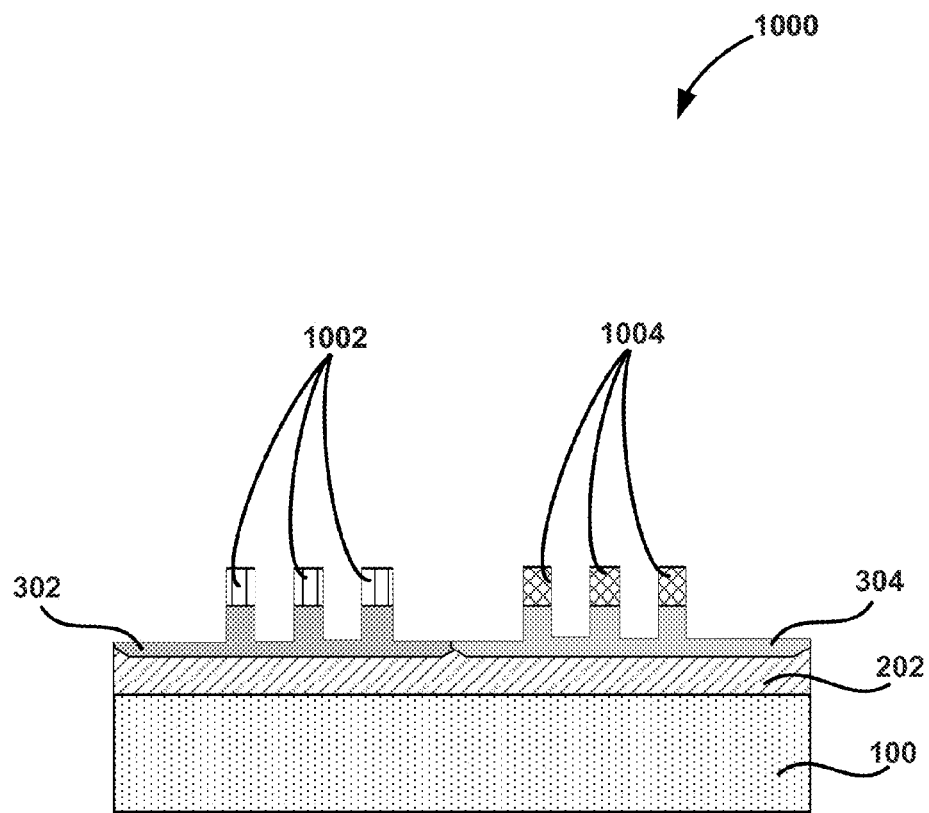
FIG. 10 illustrates a structure including fins formed by etching portions of the first feature, the second feature, and the buffer layer in accordance with various embodiments of the invention.
Figure 11:
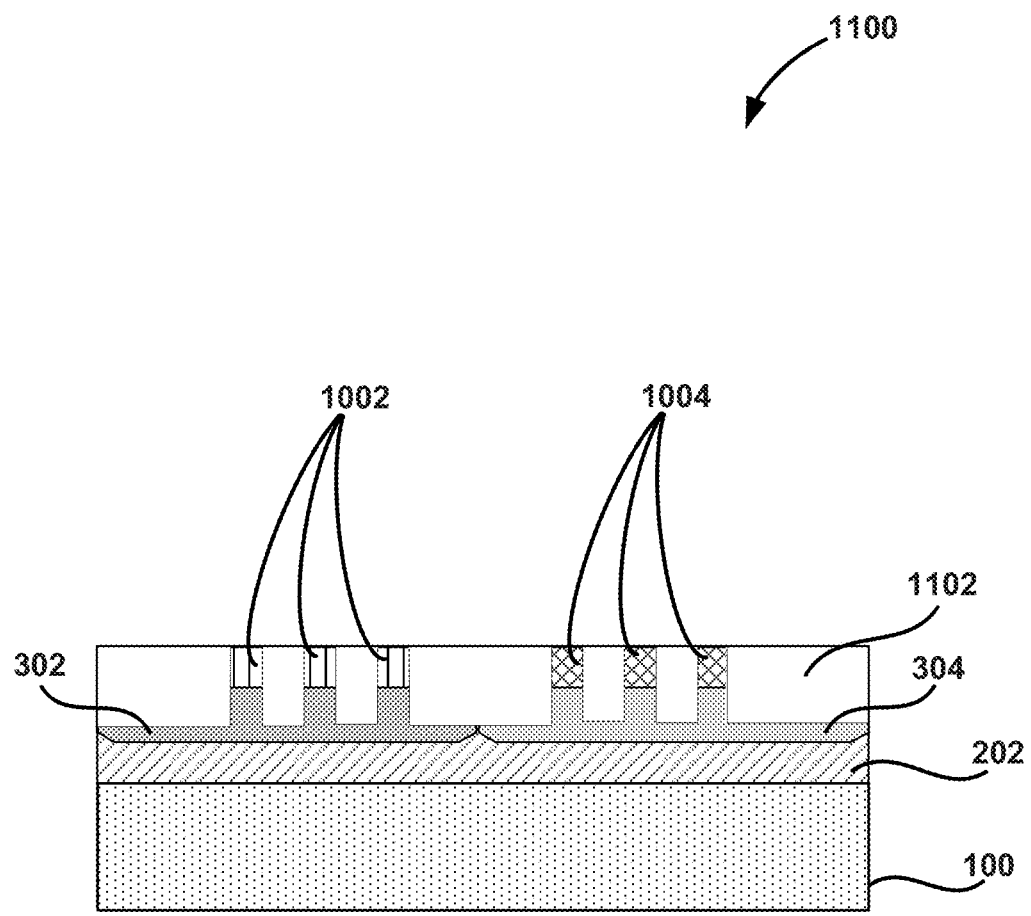
FIG. 11 illustrates a structure including insulating material deposited onto portions of the buffer layer and adjacent fins in accordance with various embodiments of the invention.
Figure 12:
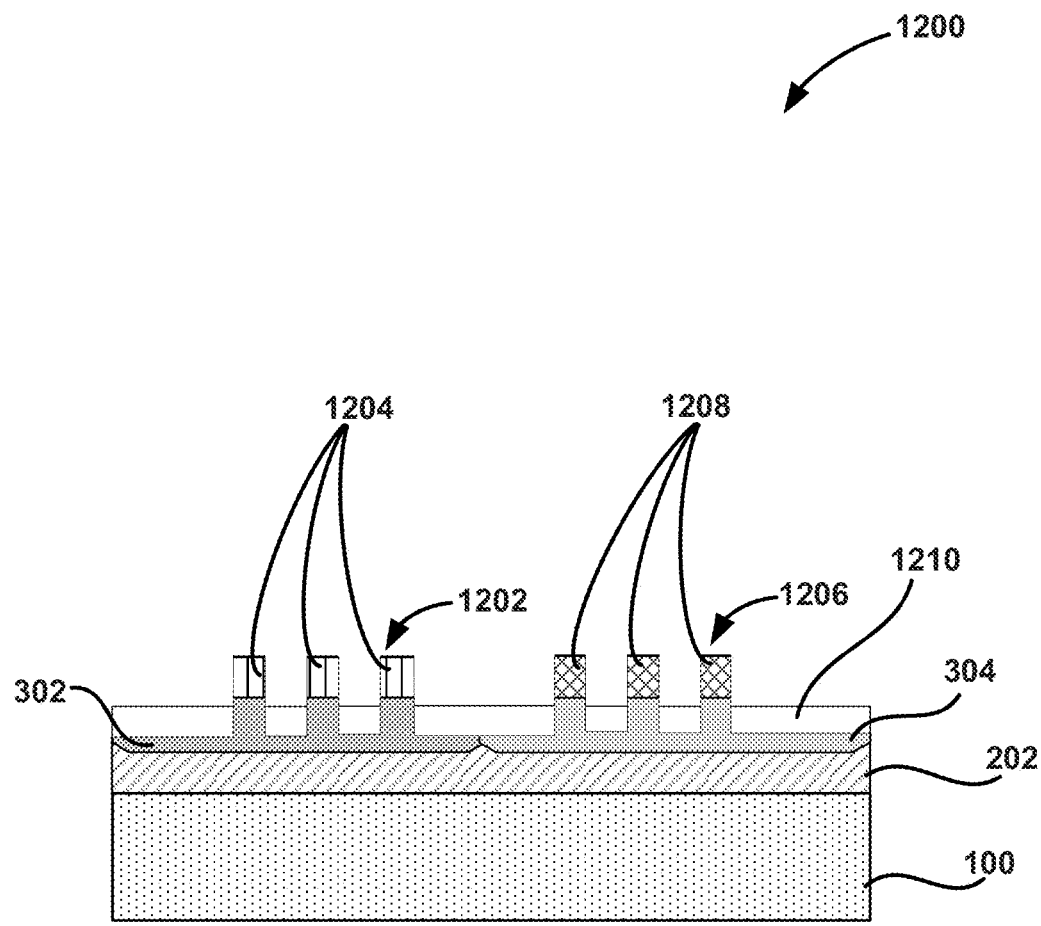
FIG. 12 illustrates a structure including fins in accordance with various embodiments of the invention.

FIG. 12 illustrates a structure 1200 in accordance with exemplary embodiments of the disclosure and FIGS. 1-11 illustrate structures formed during the fabrication of structure 1200. Structure 1200 is suitable for forming a CMOS device as discussed in more detail below. Structure 1200 includes an NMOS region 1202, including NMOS fins 1204, and a PMOS region 1206, including PMOS fins 1208. Structure 1200 is advantageous over other CMOS structures, because structure 1200 includes both NMOS regions 1202 and PMOS regions 1206, each including fins for a multiple gate device, wherein structure 1200 also includes a high-mobility channel including germanium.

Figure 1:
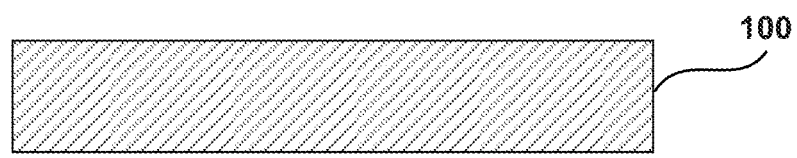
FIG. 1 illustrates a substrate in accordance with exemplary embodiments of the disclosure.

Turning now to FIG. 1, a method of forming structure, such as structure 1200, includes a step of providing a substrate 100. As used herein, a "substrate" refers to any material having a surface onto which material can be deposited. A substrate may include a bulk material such as silicon (e.g., single crystal silicon) or may include one or more layers overlying the bulk material. Further, the substrate may include various topologies, such as trenches, vias, lines, and the like formed within or on at least a portion of a layer of the substrate. By way of example, substrate 100 includes a silicon wafer doped with about $1e19/cm^3$ boron atoms.

Figure 2:
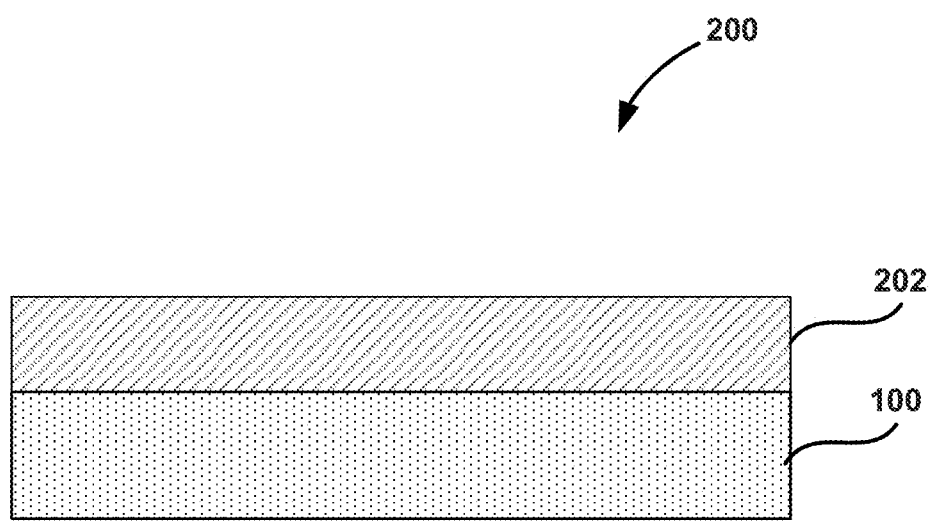
FIG. 2 illustrates a structure including a buffer layer overlying a substrate in accordance with further exemplary embodiments of the disclosure.

FIG. 2 illustrates a structure 200, including substrate 100 and a strain relaxed $Si_{1-x}Ge_x$, where x ranges from 0 to about 0.8 or 0 to about 0.5, layer 202 overlying substrate 100. In the illustrated example, layer 202 is adjacent substrate 100; however, other structures in accordance with the present disclosure may include one or more layers interposed between substrate 100 and layer 202. A thickness of layer 202 may range from about 100 nm to about 5 μm, about 300 nm to about 2 μm, or be about 2 μm. Buffer layer 202 may be doped with a suitable dopant, such as about $5e15/cm^3$ boron atoms.

Layer 202 may be formed by epitaxially growing the strain relaxed $Si_{1-x}Ge_x$ overlying substrate 100. By way of example, layer 202 may be formed using dichlorosilane ($SiH_2Cl_2$), germane ($GeH_4$), and hydrogen ($H_2$) as precursors or reactants at a temperature of about 700° C. or higher at a pressure of about 10 Torr. Another exemplary method of forming layer 202 includes using silane ($SiH_4$), germane, and hydrogen as reactants at a temperature of about 600° C. or higher at a pressure of about 10 Torr. A suitable reactor for use in forming layer 202 is available from ASM under the name Intrepid™ XP or Epsilon®.

Figure 3:
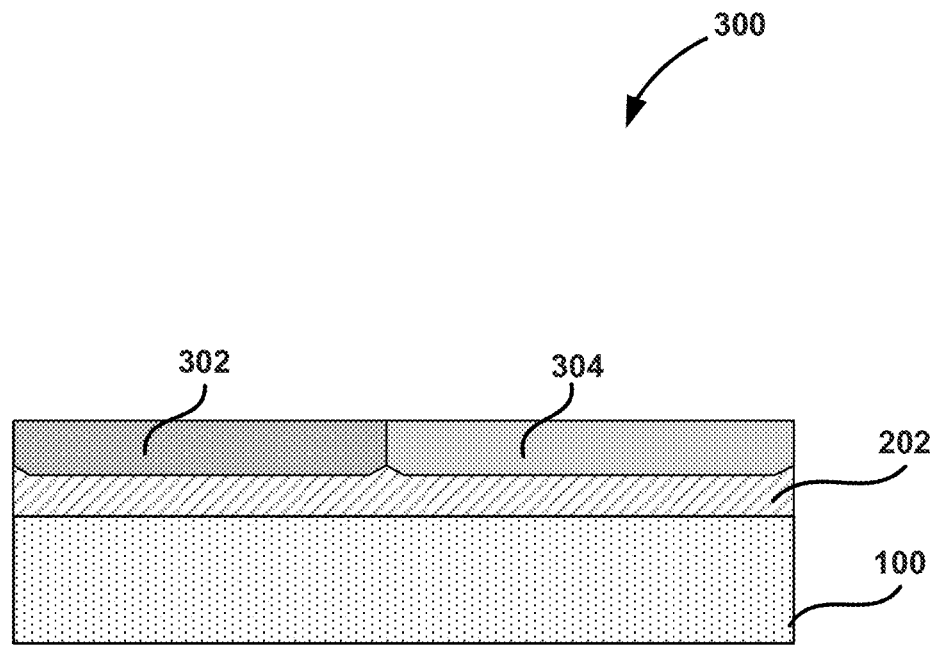
FIG. 3 illustrates a structure including a p well region and an n well region formed within a buffer layer in accordance with exemplary embodiments of the disclosure.

FIG. 3 illustrates a structure 300, which includes a p well region 302 and an n well region 304 formed within layer 202. P well region 302 and n well region 304 may be formed using any suitable technique, such as using patterning and masking techniques and boron ion implantation to form p well region 302 (e.g., about $5e17/cm^3$ boron) and similarly using patterning and masking techniques and arsenic or phosphorus ion implantation (e.g., about $5e17/cm^3$ arsenic or phosphorous) for n well region formation. Both p well and n well formation process may include an anneal process as typically used to form such regions.

Figure 4:
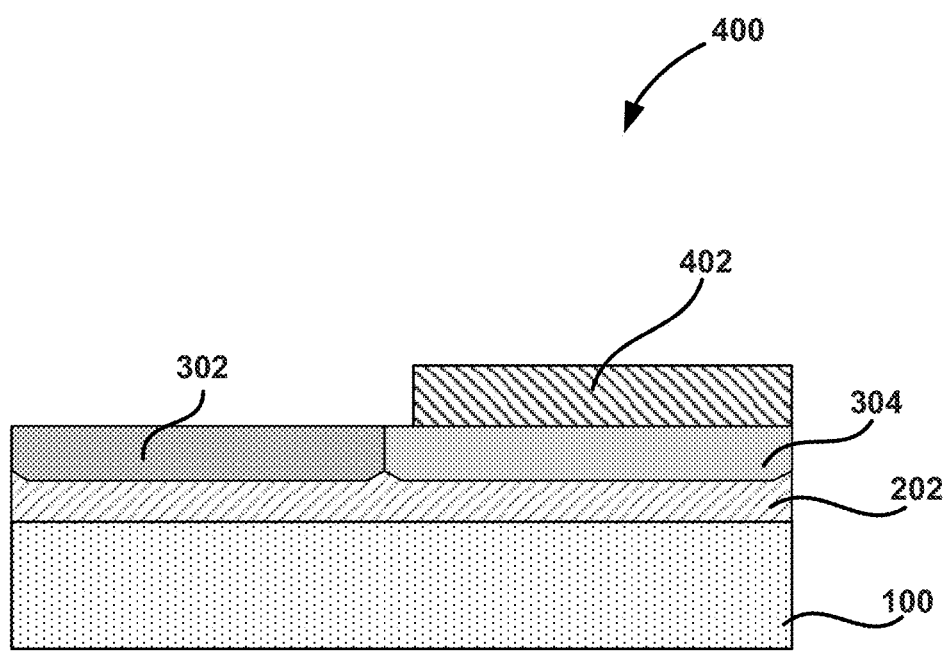
FIG. 4 illustrates a structure including a patterned hard mask overlying a buffer layer in accordance with exemplary embodiments of the disclosure.

Turning now to FIG. 4, after p well region 302 and n well region 304 are formed, a structure 400 is formed by depositing, patterning, and etching a hard mask material, such as silicon oxide ($SiO_x$), e.g., silicon dioxide ($SiO_2$), to form hard mask layer 402. The hard mask material may be deposited using, for example, plasma enhanced atomic layer deposition—e.g., using SAM.24 ($H_2Si[N(C_2H_5)_2]_2$) and oxygen ($O_2$) plasma deposited at about 400° C. or 300° C. or less. Such process may be carried out using, for example, an ASM reactor sold under the name Eagle® XP. Alternatively, the hard mask material used to form layer 402 may be deposited by chemical vapor deposition using silane or tetraethyl orthosilicate (TEOS). A thickness of layer 402 may range from about 10 nm to about 100 nm.

Figure 5:
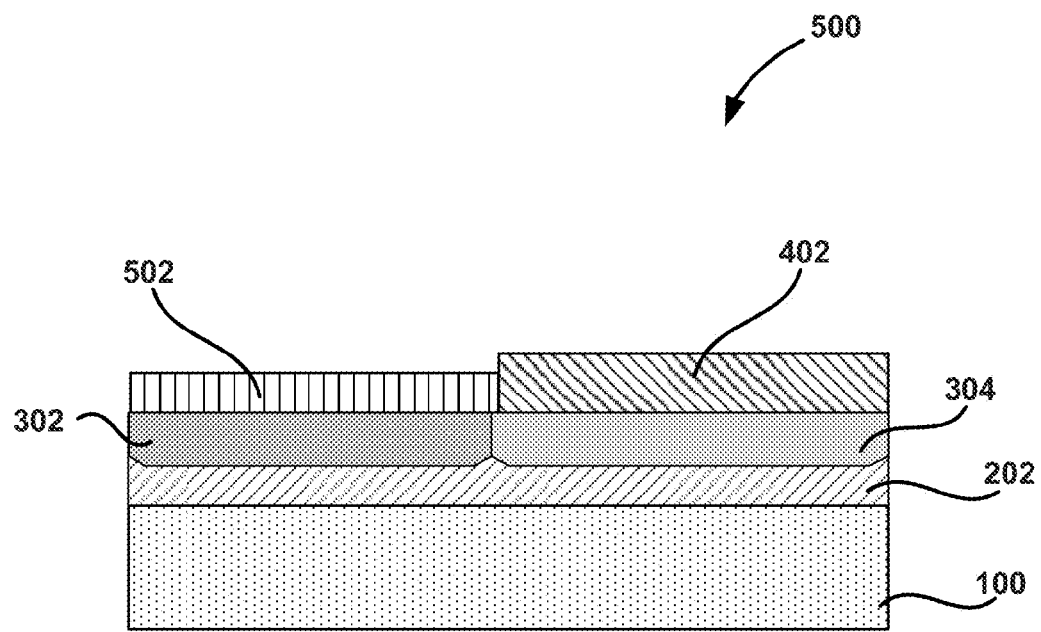
FIG. 5 illustrates a structure including a first feature formed within an opening of a hard mask and on a surface of a buffer layer according to yet additional exemplary embodiments of the present disclosure.

Next, as illustrated in FIG. 5, a structure 500 is formed by selectively depositing epitaxial material, such as epitaxial silicon overlying buffer layer 202 to form layer 502. Layer 502 may be selectively deposited over layer 202 (e.g., over region 302) using dichlorosilane, hydrogen chloride (HCl), and hydrogen as reactants at a reaction temperature of about 700° C. to 1000° C. and a reactor pressure of about 10 Torr. Another exemplary process for growing layer 502 includes using a trisilane ($Si_3H_8$) based cyclic deposit-etch process at about 400-600° C. Either process can be performed using, for example, a reactor available from ASM under the name Intrepid™ XP or Epsilon®. A germanium precursor may also be used during this step when layer 502 includes germanium. A thickness of layer 502 can vary from about 10 nm to about 50 nm. For example, a thickness of layer 502 can be about 30 nm.

Figure 6:
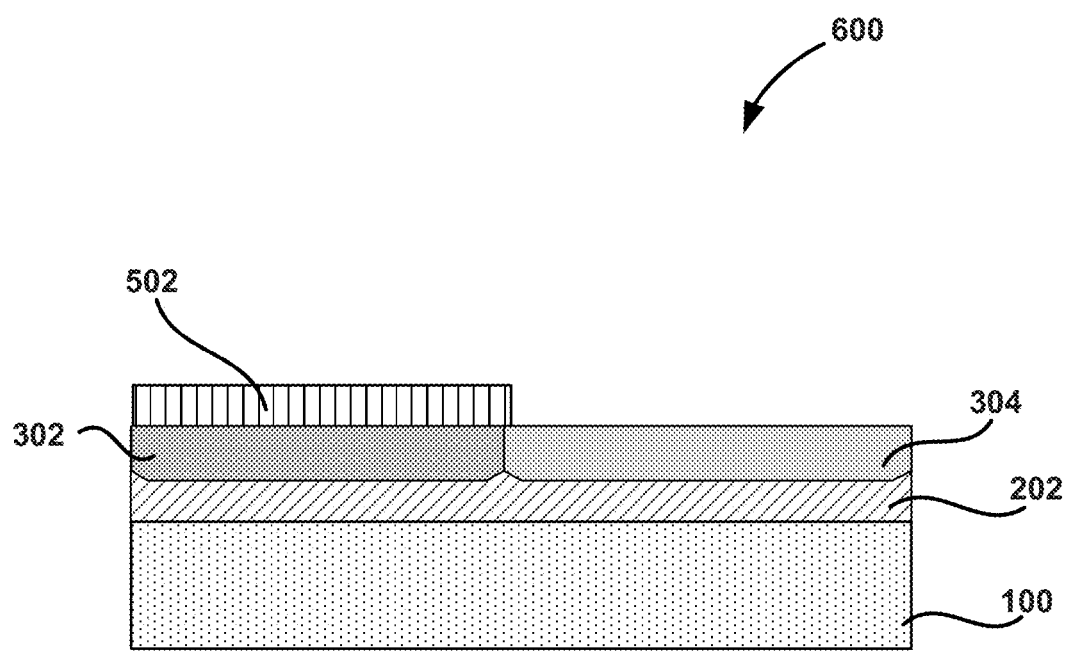
FIG. 6 illustrates a structure having a first feature on a surface of a buffer layer with the hard mask used to form the first feature removed according to additional exemplary embodiments of the present disclosure.
Figure 7:
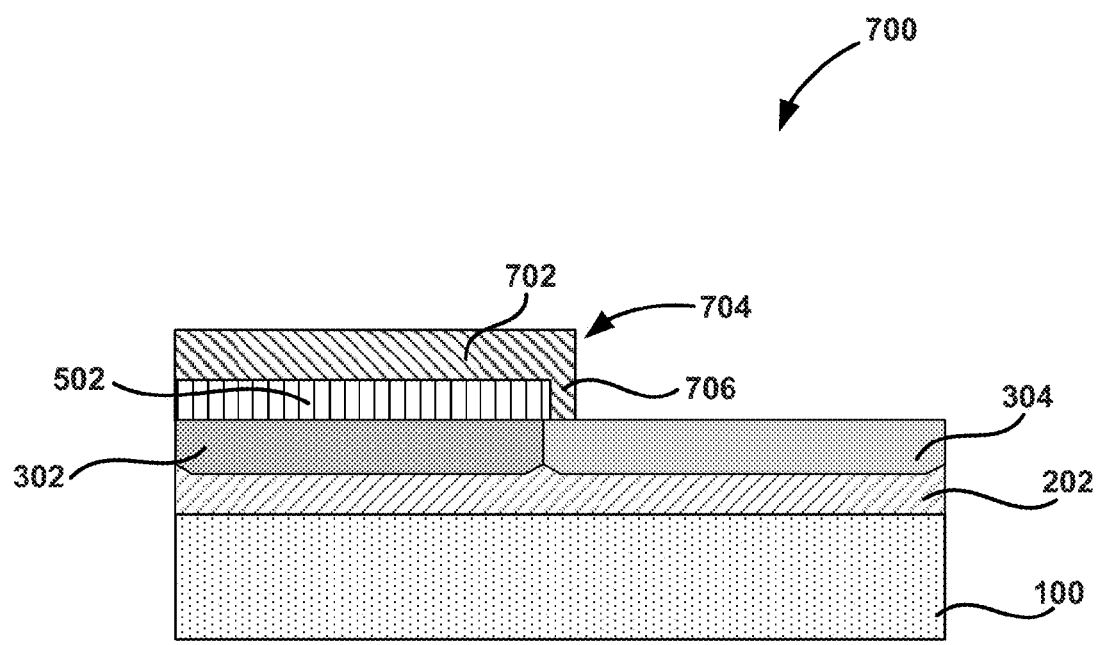
FIG. 7 illustrates a structure including a hard mask overlying and overhanging a first feature in accordance with further exemplary embodiments of the disclosure.

Next, as illustrated in FIG. 6, hard mask layer 402 is removed to form a structure 600. By way of example, layer 402 can be selectively removed using a diluted hydrofluoric acid (HF) solution. A structure 700 is formed by depositing a layer of hard mask material, such as silicon oxide, overlying layer 502, masking, and patterning the hard mask material to form layer 702. In the illustrated example, layer 702 overhangs layer 502 in region 704. Overhang 706 allows separation of epitaxial material deposited over region 304, as discussed in more detail below. Layer 702 may be deposited using the same or similar techniques used to deposit layer 404. For example, the hard mask material may be deposited using plasma enhanced atomic layer deposition—e.g., using SAM.24 ($H_2Si[N(C_2H_5)_2]_2$) and oxygen ($O_2$) plasma deposited at about 400° C. or 300° C. or less. Such process may be carried out using, for example, an ASM reactor sold under the name Eagle® XP. Alternatively, the hard mask material used to form layer 402 may be deposited by chemical vapor deposition using silane or tetraethyl orthosilicate (TEOS). A thickness of layer 702 may range from about 2 nm to about 50 nm.

Figure 8:
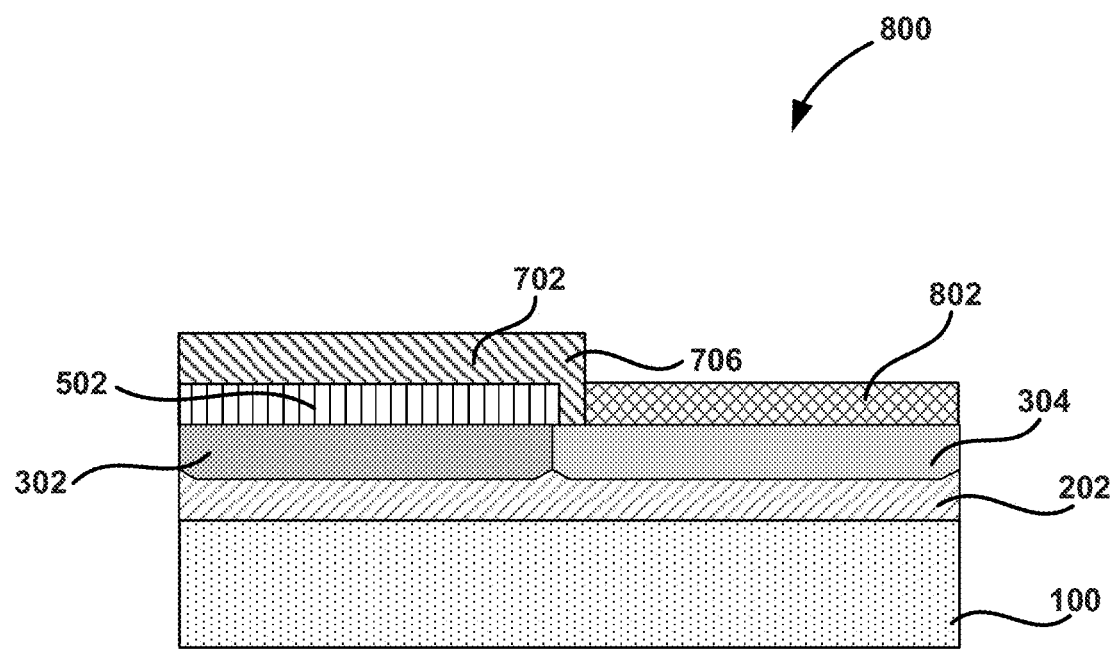
FIG. 8 illustrates a structure including a second feature formed within an opening of a hard mask and on a surface of a buffer layer according to yet additional exemplary embodiments of the present disclosure.

An epitaxial layer 802 of $Si_{1-y}Ge_y$, where y ranges from about 0.1 to 1, is then formed over region 304 to form a structure 800, illustrated in FIG. 8. By way of examples, layer 802 may be formed using an epitaxial process using germane in a nitrogen ($N_2$) carrier gas at a temperature of about 350° C. to about 550° C. and a pressure of about 10 Torr using, for example, an ASM Intrepid™ XP or Epsilon® reactor. The thickness of layer 802 is generally about the same as the thickness of layer 502 and can range from about 10 nm to about 50 nm; for example the thickness may be about 30 nm. To reduce oxygen that might otherwise be present on a surface, before deposition of layer 802, structure 700 can be exposed to an in-situ hydrofluoric acid clean process.

Figure 9:
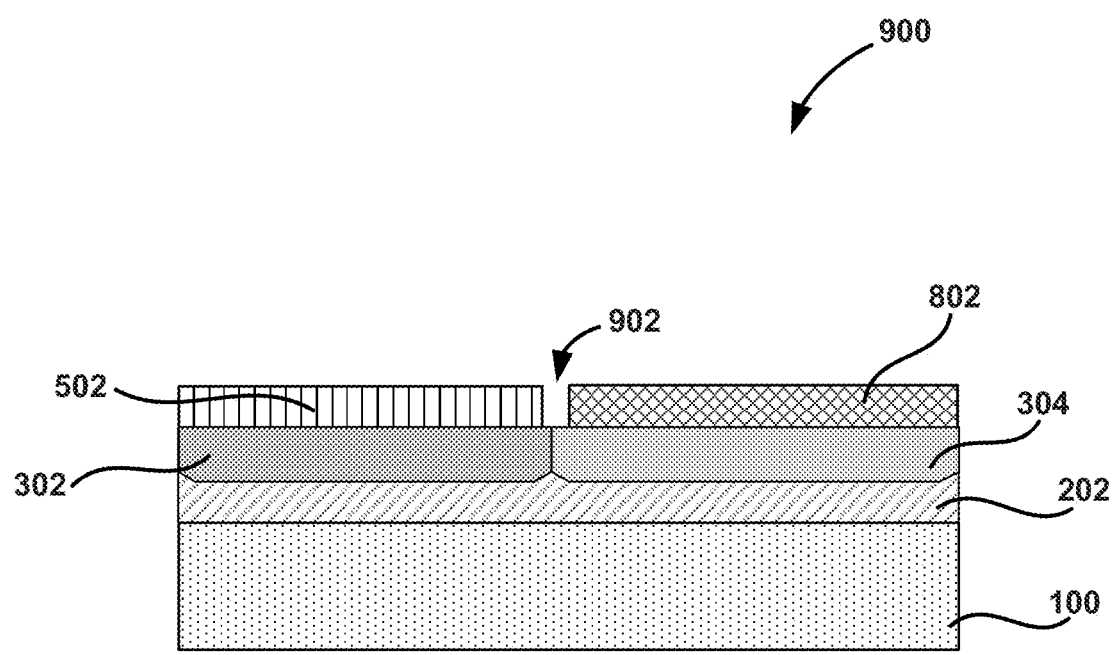
FIG. 9 illustrates a structure including a first feature and a second feature overlying a buffer layer in accordance with various embodiments of the invention.

A structure 900, illustrated in FIG. 9, is formed by selectively removing hard mask layer 702. By way of example, when layer 702 includes silicon oxide, layer 702 can be removed using a diluted hydrofluoric acid etch process. As noted above, when layer 702 includes an overhang region, a space 902 between layer 502 and 802 can form. This allows suitable isolation between NMOS and PMOS devices formed using structure 900.

Referring now to FIG. 10, a structure 1000, including fins 1002 including material from p well region and layer 502, and PMOS fins 1004, including material from n well region 304 and layer 802 are formed. Fins 1002 and 1004 may be formed using, for example, a hydrogen bromide (HBr)/chlorine ($Cl_2$)/oxygen/difluormethane ($CH_2F_2$) etch process.

After fins 1002 and 1004 are formed, a structure 1100, illustrated in FIG. 11, is formed—e.g., using shallow trench isolation (STI) techniques by depositing insulating material overlying structure 1000 to form layer 1102. By way of example, structure 1100 may be formed by depositing silicon oxide using a low temperature (e.g., about 400° C. or about 300° C. or less) atomic layer deposition process onto structure 1000. Exemplary reactants for this process include SAM.24 and an oxygen plasma. The process to form layer 1102 may be performed in an ASM Eagle® XP reactor.

Structure 1200 is formed by removing a portion of layer 1102 to form layer 1210 and fins 1204 and 1208. An exemplary process to remove a portion of layer 1102 may include a reactive ion etch process, wherein a thickness of the buffer layer within the one or more fin structures formed using the p well region and a layer comprising silicon and the one or more fin structures formed using the n well region and a layer comprising $Si_{1-y}Ge_y$ is about 20 nm to about 200 nm.

Figure 13:
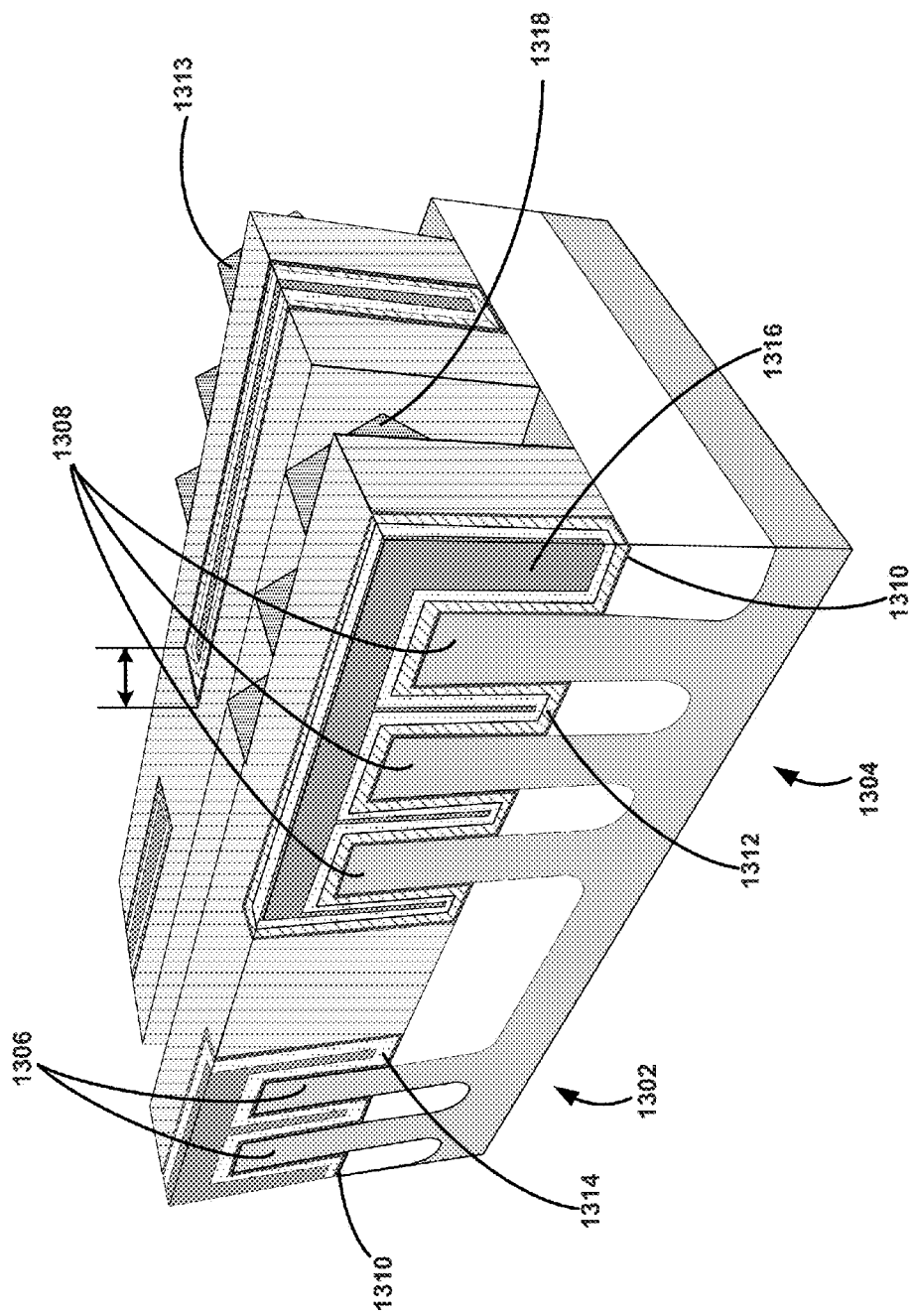
FIG. 13 illustrates a CMOS device having a structure including fins in accordance with various embodiments of the invention.

FIG. 13 illustrates a CMOS device 1300, including a structure, such as structure 1200. Device 1300 includes NMOS region 1302 and PMOS region 1304. As illustrated, NMOS region includes fins 1306 and PMOS region includes fins 1308, which may be formed of and using the materials and processes described above in connection with FIGS. 1-12. Structure 1300 additionally includes a dielectric layer 1310 and a gate metal layer 1312, 1314 respectively formed over PMOS fins and NMOS fins. Layers 1312 and 1314 may be the same or different gate metals. Similarly, although illustrated as a single gate dielectric layer, layer 1310 may be formed of a first material for the PMOS device and a second material for the NMOS device. Exemplary dielectric materials for layer 1310 include $HfO_2$. Exemplary Gate metals include TiN, which may be deposited using $TiCl_4$ and $NH_3$. A contact metal layer 1316 may then be formed overlying the gate metal for the NMOS and PMOS devices. Exemplary contact metals include tungsten, deposited, for example, using $WF_6$ and $Si_2H_6$. Structure 1300 may also include additional stressor features, such as features 1318 to increase carrier mobility, particularly in PMOS devices, as illustrated in FIG. 13.

It is to be understood that the configurations and/or approaches described herein are exemplary in nature, and that these specific embodiments or examples are not to be considered in a limiting sense. The specific routines or methods described herein may represent one or more of any number of processing strategies. Thus, the various acts illustrated may be performed in the sequence illustrated, performed in other sequences, performed simultaneously, or omitted in some cases.

The subject matter of the present disclosure includes all novel and nonobvious combinations and subcombinations of the various processes, structures and devices, and other features, functions, acts, and/or properties disclosed herein, as well as any and all equivalents thereof.

What is claimed is:

1. A method of forming a semiconductor structure, the method comprising the steps of:
    providing a substrate comprising silicon;
    forming a buffer layer comprising $Si_{1-x}Ge_x$, where x ranges from 0 to about 0.8, overlying the substrate;
    using a first selective epitaxial process, forming a first feature comprising silicon overlying the buffer layer on a surface; and
    using a second selective epitaxial process, forming a second feature comprising $Si_{1-y}Ge_y$, where y ranges from about 0.1 to 1, on the surface,
    wherein the first feature is formed overlying a p well region in the buffer layer and the second feature is formed overlying an n well region in the buffer layer.

2. The method of forming a semiconductor structure of claim 1, wherein the step of forming a first feature comprises forming a hard mask, forming openings in the hard mask, and selectively forming the first feature within at least one of the openings.

3. The method of forming a semiconductor structure of claim 2, further comprising the step of removing the hard mask.

4. The method of forming a semiconductor structure of claim 1, wherein the step of forming a second feature comprises forming a hard mask, forming openings in the hard mask, and selectively forming the second feature within at least one of the openings.

5. The method of forming a semiconductor structure of claim 4, further comprising the step of removing the hard mask.

6. The method of forming a semiconductor structure of claim 4, wherein the hard mask overhangs the first feature.

7. The method of forming a semiconductor structure of claim 6, further comprising forming a space between the first feature and the second feature, wherein the space is less than 50 nm.

8. The method of forming a semiconductor structure of claim 1, further comprising the step of etching the first feature and the second feature to form one or more fins comprising silicon and one or more fins comprising $Si_{1-y}Ge_y$, where y ranges from about 0.1 to 1.

9. The method of forming a semiconductor structure of claim 8, further comprising the step of depositing insulating material at a temperature of less than about 400° C.

10. The method of forming a semiconductor structure of claim 9, wherein the step of depositing insulating material comprises forming an oxide layer using $H_2Si[N(C_2H_5)_2]_2$ and an $O_2$ plasma.

11. The method of forming a semiconductor structure of claim 9, further comprising the step of removing a portion of the insulating material.

12. A method of forming a semiconductor structure, the method comprising the steps of:
    providing a substrate comprising silicon;
    forming a buffer layer comprising $Si_{1-x}Ge_x$, where x ranges from 0 to about 0.8, overlying the substrate;
    using a first selective epitaxial process, forming a first feature comprising silicon overlying the buffer layer on a surface; and
    using a second selective epitaxial process, forming a second feature comprising $Si_{1-y}Ge_y$, where y ranges from about 0.1 to 1, on the surface,
    wherein the step of forming a second feature comprises forming a hard mask, forming openings in the hard mask, and selectively forming the second feature within at least one of the openings, and
    wherein the hard mask overhangs the first feature.

13. The method of forming a semiconductor structure of claim 12, further comprising forming a space between the first feature and the second feature, wherein the space is less than 50 nm.

14. The method of forming a semiconductor structure of claim 12, further comprising the step of etching the first feature and the second feature to form one or more fins comprising silicon and one or more fins comprising $Si_{1-y}Ge_y$, where y ranges from about 0.1 to 1.

15. The method of forming a semiconductor structure of claim 12, wherein the first feature comprises $Si_{1-z}Ge_z$, where z ranges from 0 to about 0.7.

16. The method of forming a semiconductor structure of claim 12, further comprising the step of using shallow trench isolation techniques.

17. A method of forming a semiconductor structure, the method comprising the steps of:
    providing a substrate comprising silicon;
    forming a buffer layer comprising $Si_{1-x}Ge_x$, where x ranges from 0 to about 0.8, overlying the substrate;
    using a first selective epitaxial process, forming a first feature comprising silicon overlying the buffer layer on a surface;
    using a second selective epitaxial process, forming a second feature comprising $Si_{1-y}Ge_y$, where y ranges from about 0.1 to 1, on the surface; and
    etching the first feature and the second feature to form one or more fins comprising silicon and one or more fins comprising $Si_{1-y}Ge_y$, where y ranges from about 0.1 to 1.

18. The method of forming a semiconductor structure of claim 17, wherein the first feature comprises $Si_{1-z}Ge_z$, where z ranges from 0 to about 0.7.

19. The method of forming a semiconductor structure of claim 17, further comprising the step of using shallow trench isolation techniques.

20. The method of forming a semiconductor structure of claim 17, wherein the first feature comprises material from an n-well region.

* * * * *